(12) United States Patent
Baek et al.

(10) Patent No.: US 7,528,412 B2
(45) Date of Patent: May 5, 2009

(54) ARRAY SUBSTRATE AND DISPLAY DEVICE HAVING THE SAME

(75) Inventors: Seung-Soo Baek, Seoul (KR); Dong-Gyu Kim, Yongin-si (KR)

(73) Assignee: Samsung Electronics Co., Ltd., Suwon-si, Gyeonggi-do ( * ) Notice: Subject to any disclaimer, the term of this patent is extended or adjusted under 35 U.S.C. 154(b) by 381 days.

(21) Appl. No.: 11/416,214

(22) Filed: May 2, 2006

(65) Prior Publication Data
US 2007/0018159 A1    Jan. 25, 2007

(30) Foreign Application Priority Data
Jul. 21, 2005    (KR) ...................... 10-2005-0066354

(51) Int. Cl.
G02F 1/13    (2006.01)
(52) U.S. Cl. ............................... 257/72; 349/42; 257/98
(58) Field of Classification Search .................. 257/72, 257/225; 349/121, 42, 46, 139
See application file for complete search history.

(56) References Cited

U.S. PATENT DOCUMENTS

2004/0238823 A1*  12/2004  Lee et al. ...................... 257/72

* cited by examiner

Primary Examiner—N Drew Richards
Assistant Examiner—Mamadou Diallo
(74) Attorney, Agent, or Firm—F. Chau & Associates, LLC

(57) ABSTRACT

An array substrate includes a base substrate, a plurality of pixel electrodes, a plurality of first conductive lines, a plurality of second conductive lines and a plurality of semiconductor patterns. The pixel electrodes are disposed on the base substrate. The first conductive lines are disposed between the pixel electrodes. The second conductive lines cross the first conductive lines at crossing parts to form a matrix shape. At least two of the second conductive lines are disposed between adjacent pixel electrodes. A distance between the two second conductive lines corresponding to the crossing parts is substantially a maximum distance between the two second conductive lines along a length of the two second conductive lines. The semiconductor patterns are disposed on the crossing parts, respectively. Each of the semiconductor patterns has a greater area than each of the crossing parts. A distance between adjacent semiconductor patterns is smaller than the maximum distance.

11 Claims, 6 Drawing Sheets

ARRAY SUBSTRATE AND DISPLAY DEVICE HAVING THE SAME

CROSS-REFERENCE OF RELATED APPLICATION

The present application claims priority from Korean Patent Application No. 2005-66354, filed on Jul. 21, 2005, in the Korean Intellectual Property Office (KIPO), the disclosure of which is hereby incorporated herein by reference in its entirety.

BACKGROUND OF THE INVENTION

1. Field of the Invention

The present invention relates to an array substrate and a display device having the array substrate. More particularly, the present invention relates to an array substrate having a semiconductor layer having an area greater than an area of a crossing part of a gate line and a data line.

2. Description of Related Art

A liquid crystal display (LCD) device includes an array substrate. The array substrate includes gate and data lines arranged in a matrix shape. Each of the gate lines and each of the data lines are electrically connected to pixel electrodes of the array substrate. To increase a viewing angle and to decrease the number of driver integrated circuits, the array substrate may be implemented with a dual-line structure. In the dual-line structure, two gate lines or two data lines are electrically connected to each pixel electrode of the array substrate. An opening ratio of the array substrate having the dual-line structure is changed by a distance between two adjacent lines that are interposed between two adjacent pixels. The distance between the two adjacent lines is determined by a resolution of an exposure unit of a lithography apparatus for manufacturing the array substrate.

In addition, the data and gate lines cross each other, and the data lines cross storage lines, such that crosstalk or a short-circuit may occur between the crossed lines. Furthermore, the data lines may be disconnected by stepped portions formed by the gate lines. To decrease the crosstalk, overlapping areas between the lines are decreased, and a buffer layer is formed between the lines. However, when the overlapping areas between the lines are decreased, the likelihood of disconnection of the lines is increased. In addition, when the buffer layer is formed between the lines, the opening ratio is decreased.

Therefore, a need exists for an array substrate having a semiconductor layer having an area greater than an area of a crossing part of a gate line and a data line.

SUMMARY OF THE INVENTION

An array substrate in accordance with an exemplary embodiment of the present invention includes a base substrate, a plurality of pixel electrodes, a plurality of first conductive lines, a plurality of second conductive lines and a plurality of semiconductor patterns. The pixel electrodes are disposed on the base substrate. The first conductive lines are disposed between the pixel electrodes. The second conductive lines cross the first conductive lines at crossing parts to form a matrix shape. At least two of the second conductive lines are disposed between adjacent pixel electrodes. A distance between the two second conductive lines at the crossing parts is substantially a maximum distance between the two second conductive lines along a length of the two second conductive lines. The semiconductor patterns are disposed on the crossing parts, respectively. Each of the plurality of semiconductor patterns has a greater area than each of the crossing parts. A distance between adjacent semiconductor patterns is smaller than the maximum distance.

A display device in accordance with an exemplary embodiment of the present invention includes an array substrate, an opposite substrate and a liquid crystal layer. The array substrate includes a lower base substrate, a plurality of pixel electrodes, a plurality of first conductive lines, a plurality of second conductive lines and a plurality of semiconductor patterns. The pixel electrodes are disposed on the lower base substrate. The first conductive lines are disposed between the pixel electrodes. The second conductive lines cross the first conductive lines at crossing parts to form a matrix shape. At least two of the second conductive lines are disposed between adjacent pixel electrodes. A distance between the two second conductive lines at the crossing parts is substantially a maximum distance between the two second conductive lines along a length of the two second conductive lines. The semiconductor patterns are disposed on the crossing parts, respectively. Each of the semiconductor patterns has a greater area than each of the crossing parts. A distance between adjacent semiconductor patterns is smaller than the maximum distance. The opposite substrate includes an upper base substrate and a common electrode on the upper base substrate. The liquid crystal layer is interposed between the array substrate and the opposite substrate.

The array substrate includes a thin film transistor (TFT) substrate, a color filter on array (COA) substrate, etc. The opposite substrate includes a color filter substrate, a common electrode substrate, etc.

BRIEF DESCRIPTION OF THE DRAWINGS

The present invention will become more apparent by describing in detail exemplary embodiments thereof with reference to the accompanying drawings, in which.

DETAILED DESCRIPTION OF PREFERRED EMBODIMENTS

Figure 1:
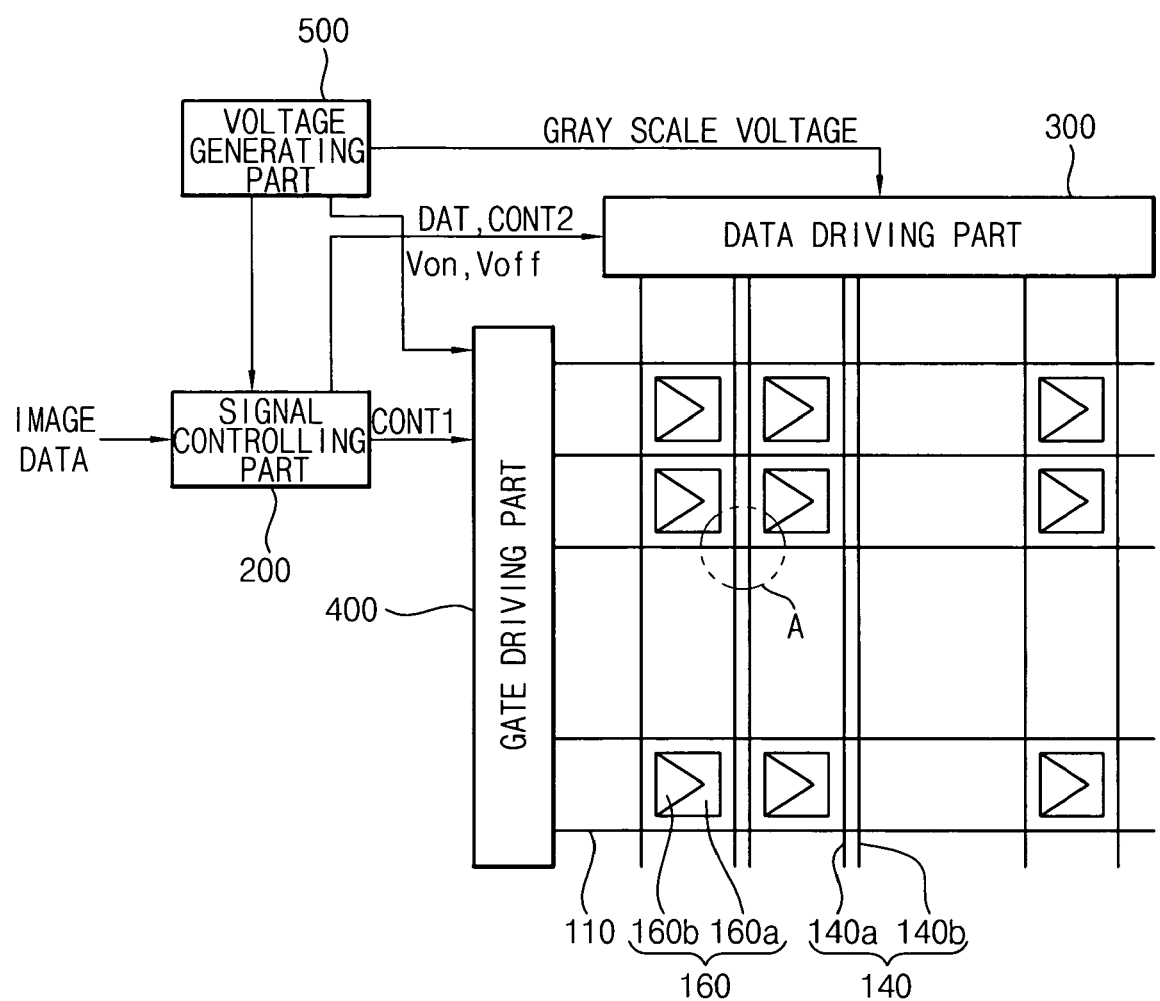
FIG. 1 is a plan view showing an array substrate in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
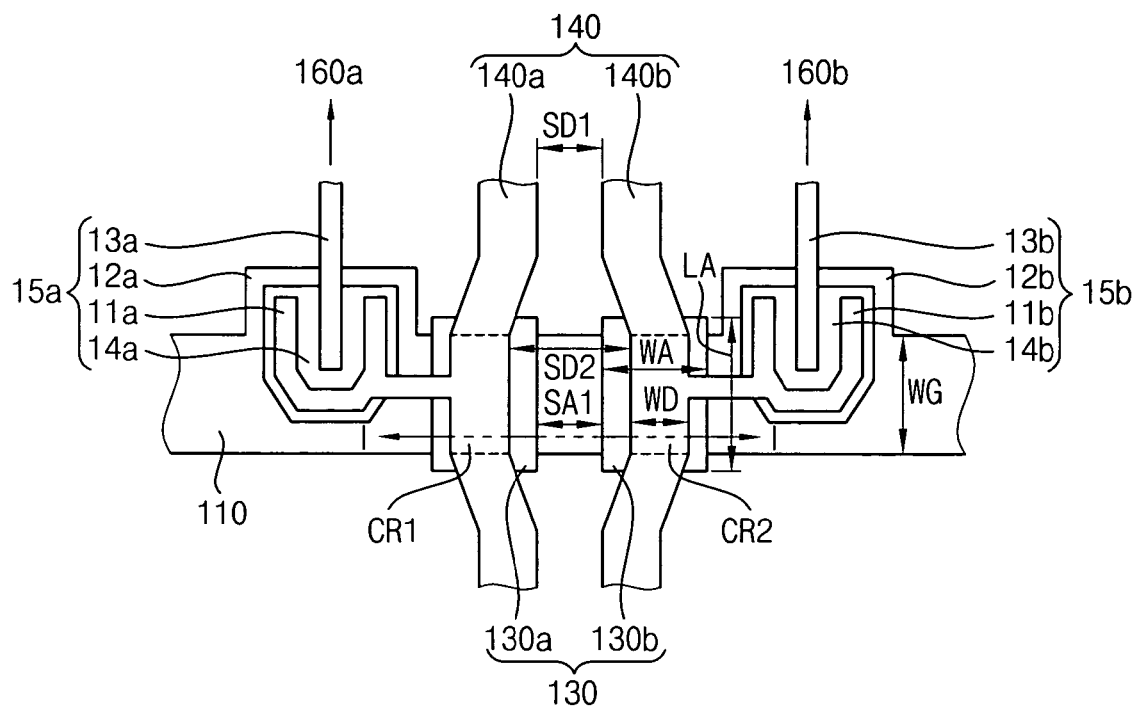
FIG. 2 is an enlarged plan view showing a portion 'A' shown in FIG. 1.
Figure 3:
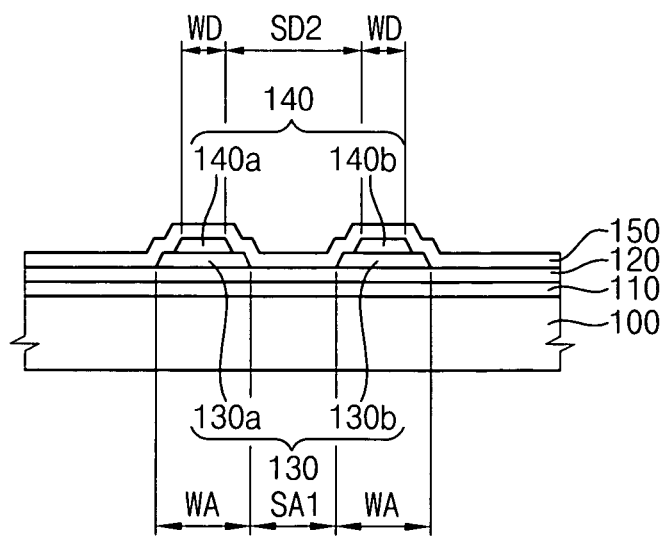
FIG. 3 is a cross-sectional view taken along a line I-I' shown in FIG. 2.

FIG. 1 is a plan view showing an array substrate in accordance with an exemplary embodiment of the present invention. FIG. 2 is an enlarged plan view showing a portion 'A' shown in FIG. 1. FIG. 3 is a cross-sectional view taken along a line I-I' shown in FIG. 2.

Referring to FIGS. 1 to 3, the array substrate includes a base substrate 100, a plurality of gate lines 110, a plurality of data lines 140 and a plurality of pixel electrodes 160. The base substrate 100 includes a transparent insulating material. The gate lines 110 are disposed on the base substrate 100. The gate lines 110 are arranged substantially in parallel with each other. The data lines 140 cross the gate lines 110 at a substantially perpendicular angle. The pixel electrodes 160 are disposed in pixel regions defined by the gate and data lines 110 and 140.

Each of the pixel electrodes 160 includes a first sub pixel electrode 160a and a second sub pixel electrode 160b. Each of the data lines 140 includes a first data line 140a and a second data line 140b. The first data line 140a is electrically connected to the first sub pixel electrode 160a. The second data line 140b is electrically connected to the second sub pixel electrode 160b. Voltages applied to the first and second sub pixel electrodes 160a and 160b are different from each other so that tilting angles of liquid crystals controlled by the first and second sub pixel electrodes 160a and 160b are different from each other, thereby increasing a viewing angle of a liquid crystal display (LCD) device having the array substrate.

A signal controlling part 200 applies control signals for driving data and gate driving parts 300 and 400 based on image data that is outputted from an externally provided unit such as a graphic card of a computer. The control signals of the signal controlling part 200 and the image data may be digital signals. The control signals of the signal controlling part 200 include a data signal DAT, a first control signal CONT1, a second control signal CONT2, etc. The data signal DAT and the second control signal CONT2 are applied to the data driving part 300, and the first control signal CONT1 is applied to the gate driving part 400.

A voltage generating part 500 applies a gray scale voltage to the data driving part 300 and an on-voltage Von and an off-voltage Voff to the gate driving part 400.

The data driving part 300 applies a signal voltage to each of the data lines 140 based on the data signal DAT and the second control signal CONT2 of the signal controlling part 200 and the gray scale voltage generated from the voltage generating part 500.

The gate driving part 400 applies the on-voltage Von and the off-voltage Voff generated from the voltage generating part 500 to the gate lines 110 based on the first control signal CONT1 of the signal controlling part 200, in sequence, so that the signal voltage is applied to each of the data lines 140.

Referring to FIGS. 2 and 3, a gate insulating layer 120 is formed on the gate lines 110, and a semiconductor pattern 130 is formed on crossing parts on which the gate lines 110 cross the data lines 140. A protecting layer 150 is formed on the data lines 140. The protecting layer 150 may include an inorganic insulating material or an organic insulating material.

The semiconductor pattern 130 may have a substantially rectangular shape. A width WA of the semiconductor pattern 130 is greater than a width WD of each of the data lines 140, and a length LA of the semiconductor pattern 130 is greater than a width WG of each of the gate lines 110, thereby decreasing crosstalk between the gate and data lines 110 and 140 and the likelihood of a disconnection of the data lines 140.

Each crossing part includes a first crossing portion CR1 and a second crossing portion CR2. A first data line 140a and the second data line 140b of the data lines 140 cross one of the gate lines 110 on the first crossing portion CR1 and on the second crossing portion CR2, respectively. The semiconductor pattern 130 includes a first semiconductor pattern 130a on the first crossing portion CR1 and a second semiconductor pattern 130b on the second crossing portion CR2.

In FIGS. 2 and 3, a distance SD2 between portions of the first and second data lines 140a and 140b corresponding to the first and second crossing portions CR1 and CR2 is greater than a distance SD1 between portions of the first and second data lines 140a and 140b outside of the crossing portions. That is, a distance SD2 between portions of the first and second data lines 140a and 140b corresponding to the first and second crossing portions CR1 and CR2 may be substantially a maximum distance between the first and second data lines 140a and 140b along a length of the first and second data lines 140a and 140b. For example, the distance SD1 between the portions of the first and second data lines 140a and 140b outside of the crossing portions may be substantially the same as a distance SA1 between the first and second semiconductor patterns 130a and 130b. The distance SA1 between the first and second semiconductor patterns 130a and 130b and the distance SD1 between the portions of the first and second data lines 140a and 140b outside of the crossing portions may be substantially same as or greater than a resolution of an exposure unit of a lithography apparatus for manufacturing a device according to an exemplary embodiment of the present invention. For example, the distance between the first and second semiconductor patterns 130a and 130b may be no less than about 3 μm when manufactured using an exposure unit having a resolution of about 3 μm.

The array substrate may further include a first TFT 15a and a second TFT 15b.

The first TFT 15a includes a first gate electrode 12a, a first channel layer 14a, a first source electrode 11a and a first drain electrode 13a. The first gate electrode 12a is electrically connected to one of the gate lines 110. The first channel layer 14a is disposed on the first gate electrode 12a. The first source electrode 11a is electrically connected to the first data line 140a. The first drain electrode 13a is electrically connected to the first sub pixel electrode 160a.

The second TFT 15b includes a second gate electrode 12b, a second channel layer 14b, a second source electrode 11b and a second drain electrode 13b. The second gate electrode 12b is electrically connected to one of the gate lines 110. The second channel layer 14b is disposed on the second gate electrode 12b. The second source electrode 11b is electrically connected to the second data line 140b. The second drain electrode 13b is electrically connected to the second sub pixel electrode 160b.

Figure 4:
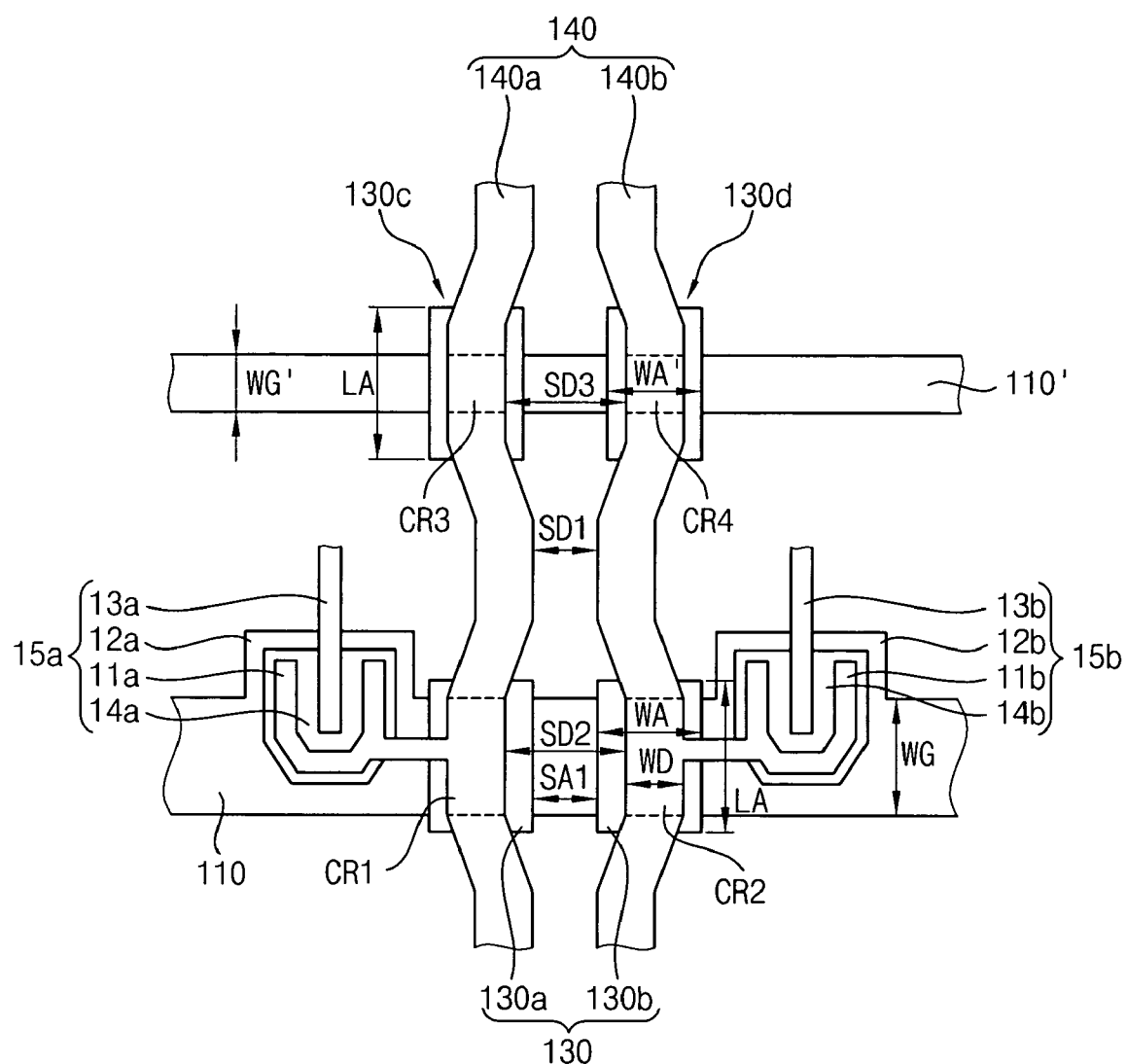
FIG. 4 is an enlarged plan view showing an array substrate in accordance with another embodiment of the present invention.

FIG. 4 is an enlarged plan view showing an array substrate in accordance with an exemplary embodiment of the present invention. The array substrate of FIG. 4 is substantially the same as in FIGS. 1 to 3, and further includes a storage line, a third semiconductor pattern and a fourth semiconductor pattern. The same reference numerals will be used to refer to the same or like parts as those described in FIGS. 1 to 3 and any further explanation concerning the above elements will be omitted.

Referring to FIG. 4, the array substrate includes a storage line 110'. The storage line 110' may be formed from the same layer as gate lines 110. The storage line 110' crosses the first data line 140a and the second data line 140b. The first data line 140a crosses the storage line 110' on a third crossing portion CR3. The second data line 140b crosses the storage line 110' on a fourth crossing portion CR4. A third semiconductor pattern 130c is disposed on the third crossing portion CR3, and a fourth semiconductor pattern 130d is disposed on the fourth crossing portion CR4.

Each of the semiconductor patterns 130c and 130d may have a substantially rectangular shape. A width WA of each of the semiconductor patterns 130c and 130d is greater than a width WD of each of the data lines 140, and a length LA of each of the semiconductor patterns 130c and 130d is greater than a width WG of each of the storage line 110', thereby decreasing crosstalk between the storage line 110' and the data lines 140 and the likelihood of a disconnection of the data lines 140.

A distance SD3 between portions of the first and second data lines 140a and 140b corresponding to the third and fourth crossing portions CR3 and CR4 is greater than a distance SD1 between portions of the first and second data lines 140a and 140b outside of the crossing portions. The distance SD3 between portions of the first and second data lines 140a and 140b corresponding to the third and fourth crossing portions CR3 and CR4 may be substantially a maximum distance between the first and second data lines 140a and 140b along a length of the first and second data lines 140a and 140b. For example, the distance SD3 between the portions of the first and second data lines 140a and 140b outside of the crossing portions may be substantially same as a distance between the third and fourth semiconductor patterns 130c and 130d. The distance between the third and fourth semiconductor patterns 130c and 130d and the first and second data lines 140a and 140b outside of the crossing portions may be substantially same as or greater than the resolution of the exposure unit.

Figure 5:
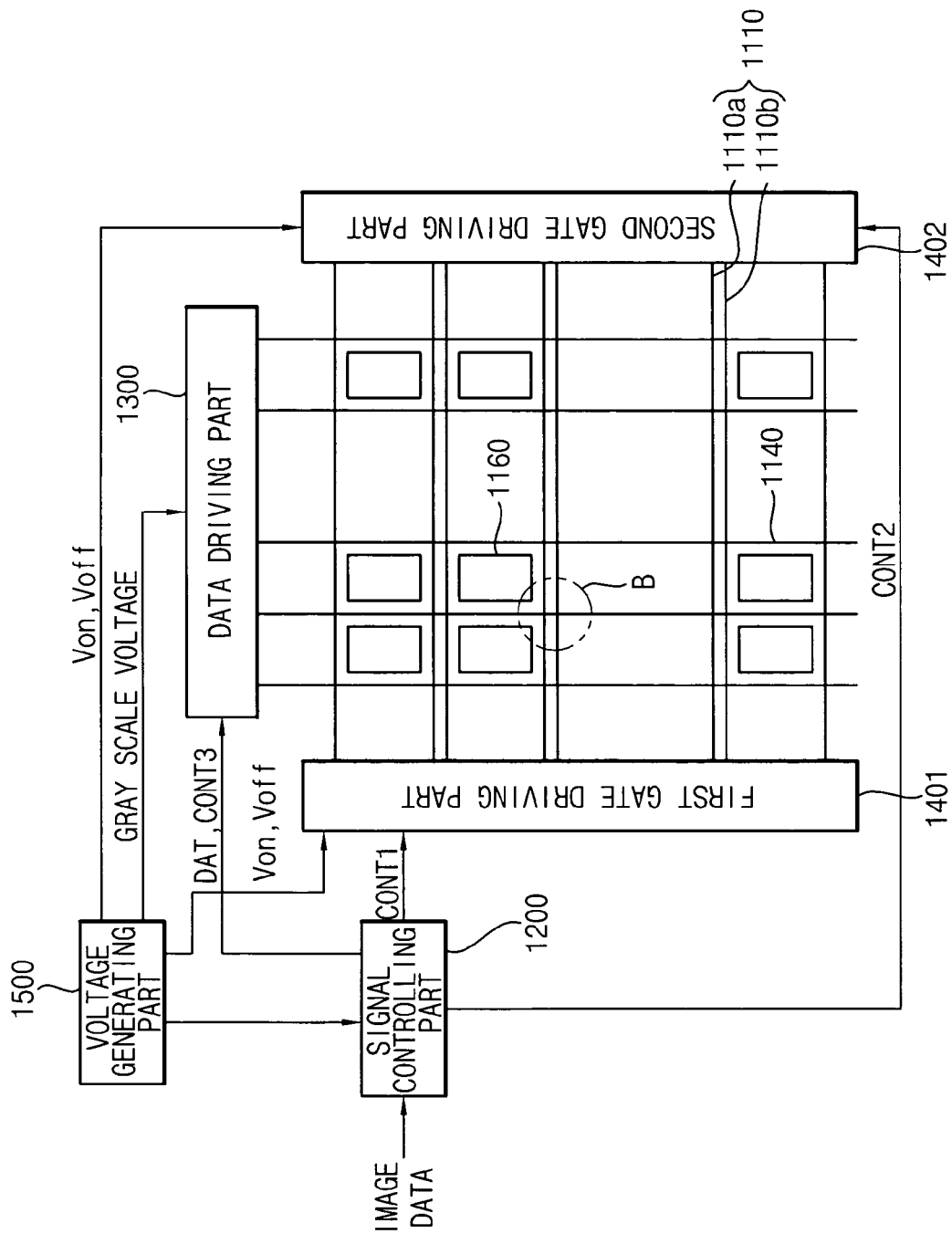
FIG. 5 is a plan view showing an array substrate in accordance with an exemplary embodiment of the present invention.
Figure 6:
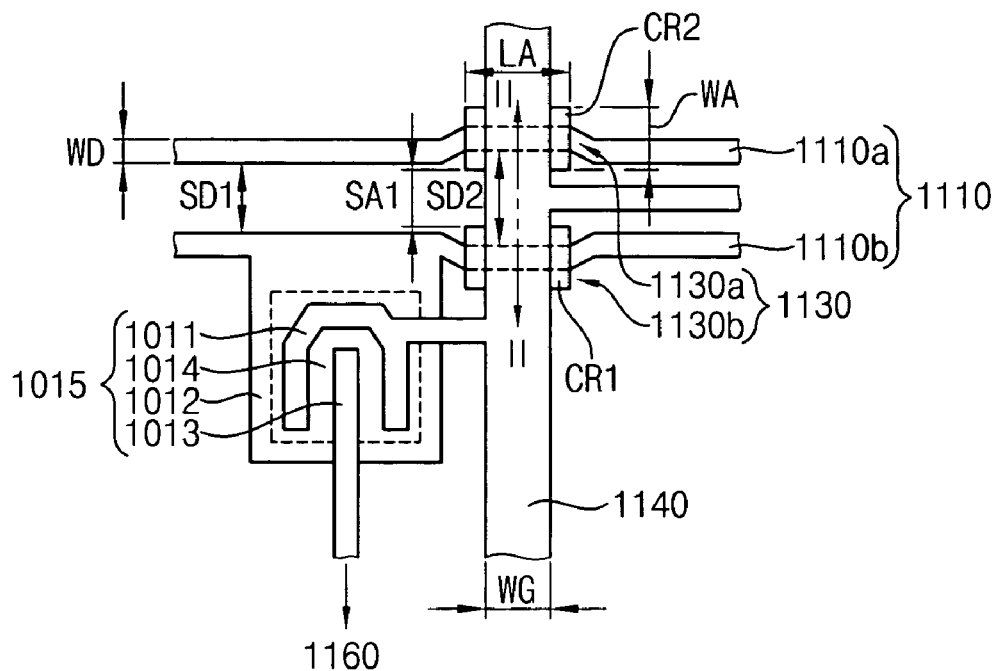
FIG. 6 is an enlarged plan view showing a portion 'B' shown in FIG. 5.
Figure 7:
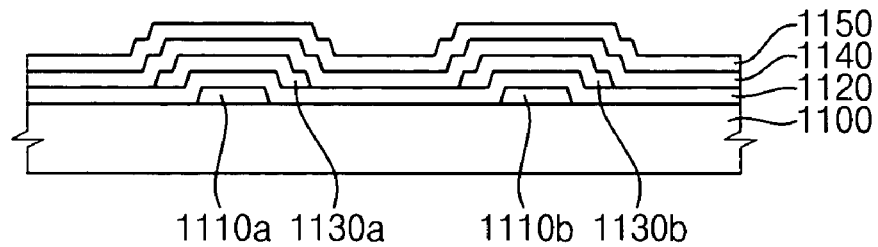
FIG. 7 is a cross-sectional view taken along a line II-II' shown in FIG. 6.

FIG. 5 is a plan view showing an array substrate in accordance with an exemplary embodiment of the present invention. FIG. 6 is an enlarged plan view showing a portion 'B' shown in FIG. 5. FIG. 7 is a cross-sectional view taken along a line II-II' shown in FIG. 6. The same reference numerals will be used to refer to the same or like parts as those described in FIGS. 1 to 3 and any further explanation concerning the above elements will be omitted.

Referring to FIGS. 5 to 7, the array substrate includes a base substrate 1100, a plurality of gate lines 1110, a plurality of data lines 1140 and a plurality of pixel electrodes 1160. The gate lines 1110 are disposed on the base substrate 1100. The gate lines 110 are arranged substantially in parallel with each other. The data lines 1140 cross the gate lines 1110. The pixel electrodes 1160 are disposed in pixel regions defined by the gate and data lines 1110 and 1140.

Each of the gate lines 1110 includes a first gate line 1110a and a second gate line 1110b. The first gate line 1110a transmits a first gate signal generated from a first gate driving part 1401 to the pixel electrode 1160. The second gate line 1110b transmits a second gate signal generated from a second gate driving part 1402 to the pixel electrode 1160. The array substrate has a dual gate line structure. In the dual gate line structure, an LCD device having the array substrate may be operated in a column inversion mode. In FIGS. 5 to 7, the first gate signal corresponds to odd numbered gate lines, and the second gate signal corresponds to even numbered gate lines.

A signal controlling part 1200 applies control signals for driving data and gate driving parts 1300, 1401 and 1402 based on image data IMAGE_DATA that is outputted from an externally provided unit such as a graphic card of a computer. The control signals of the signal controlling part 1200 and the image data IMAGE_DATA may be digital signals. The control signals of the signal controlling part 1200 include a data signal DAT, a first control signal CONT1, a second control signal CONT2, etc. The data signal DAT and the second control signal CONT2 are applied to the data driving part 1300, and the first control signal CONT1 is applied to the gate driving parts 1401 and 1402.

A voltage generating part 1500 applies a grey scale voltage to the data driving part 1300 and an on-voltage Von and an off-voltage Voff to the gate driving parts 1401 and 1402.

The data driving part 1300 applies a signal voltage to each of the data lines 1140 based on the data signal DAT and the second control signal CONT2 of the signal controlling part 1200 and the gray scale voltage generated from the voltage generating part 1500.

The gate driving parts 1401 and 1402 apply the on-voltage Von and the off-voltage Voff generated from the voltage generating part 1500 to the gate lines 1110 based on the first control signal CONT1 of the signal controlling part 1200, in sequence, so that the signal voltage is applied to each of the gate lines 1110.

In FIGS. 6 and 7, a gate insulating layer 1120 is formed on the gate lines 1110, and a semiconductor pattern 1130 is formed on a crossing part on which the gate lines 1110 cross the data lines 1140. A protecting layer 1150 is formed on the data lines 1140. The protecting layer 1150 includes an inorganic insulating material or an organic insulating material.

The semiconductor pattern 1130 may have a substantially rectangular shape. A width WA of the semiconductor pattern 1130 is greater than a width WD of each of the gate lines 1110, and a length LA of the semiconductor pattern 1130 is greater than a width WG of each of the data lines 1140, thereby decreasing crosstalk between the gate and data lines 1110 and 1140 and the likelihood of a disconnection of the data lines 1140.

The crossing part includes a first crossing portion CR1 and a second crossing portion CR2. A first gate line 1110*a* crosses one of the data lines 1140 on the first crossing portion CR1. A second gate line 1110*b* crosses one of the data lines 1140 on the second crossing portion CR2. The semiconductor pattern 1130 includes a first semiconductor pattern 1130*a* disposed on the first crossing portion CR1 and a second semiconductor pattern 1130*b* disposed on the second crossing portion CR2.

In FIGS. 6 and 7, a distance SD2 between portions of the first and second gate lines 1110*a* and 1110*b* corresponding to the first and second crossing portions CR1 and CR2 is greater than a distance SD1 between portions of the first and second gate lines 1110*a* and 1110*b* outside the crossing portions. The distance SD2 between portions of the first and second gate lines 1110*a* and 1110*b* corresponding to the first and second crossing portions CR1 and CR2 may be substantially a maximum distance between the first and second gate lines 1110*a* and 1110*b* along a length of the first and second gate lines 1110*a* and 1110*b*. For example, the distance SD1 between the portions of the first and second gate lines 1110*a* and 1110*b* outside the crossing portions may be substantially the same as a distance between the first and second semiconductor patterns 1130*a* and 1130*b*. The distance SA1 between the first and second semiconductor patterns 1130*a* and 1130*b* and the distance SD1 between the portions of the first and second gate lines 1110*a* and 1110*b* outside the crossing portions may be substantially same as or greater than the resolution of the exposure unit.

The array substrate may further include a first TFT 1015 and a second TFT (not shown).

The first TFT 1015 includes a first gate electrode 1012, a first channel layer 1014, a first source electrode 1011 and a first drain electrode 1013. The first gate electrode 1012 is electrically connected to the second gate line 1110*b*. The first channel layer 1014 is disposed on the first gate electrode 1012. The first source electrode 1011 is electrically connected to one of the data lines 1140. The first drain electrode 1013 is electrically connected to the pixel electrode 1160.

The second TFT (not shown) includes a second gate electrode (not shown), a second channel layer (not shown), a second source electrode (not shown) and a second drain electrode (not shown). The second gate electrode (not shown) is electrically connected to the first gate line 1110*a*. The first channel layer (not shown) is disposed on the second gate electrode (not shown). The second source electrode (not shown) is electrically connected to one of the data lines 1140. The second drain electrode (not shown) is electrically connected to the pixel electrode 1160.

Figure 8:
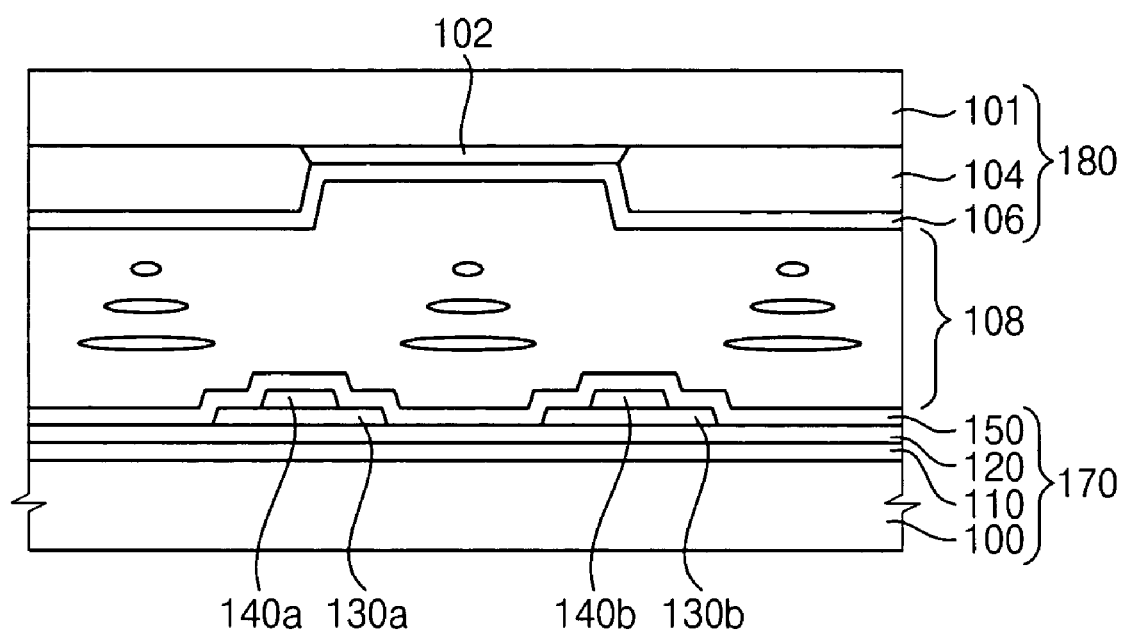
FIG. 8 is a cross-sectional view showing a liquid crystal display (LCD) device in accordance with an exemplary embodiment of the present.

FIG. 8 is a cross-sectional view showing a liquid crystal display (LCD) device in accordance with an exemplary embodiment of the present invention. The array substrate of FIG. 8 is substantially the same as in FIGS. 1 to 3. The same reference numerals will be used to refer to the same or like parts as those described in FIGS. 1 to 3 and any further explanation concerning the above elements will be omitted.

Referring to FIG. 8, the LCD device includes an array substrate 170, a liquid crystal layer 108 and a color filter substrate 180.

The liquid crystal layer 108 is interposed between the array substrate 170 and the color filter substrate 180.

The color filter substrate 180 includes an upper base substrate 101, a black matrix 102, a color filter 104 and a common electrode 106.

The black matrix 102 is disposed on the upper base substrate 101 to block a light passing through a region in which liquid crystals of the liquid crystal layer 108 are not controllable.

The color filter 104 corresponds to a pixel electrode 160. The color filter 104 may be arranged in a matrix shape disposed on the upper base substrate 101.

The common electrode 106 is disposed on the upper base substrate 101 having the black matrix 102 and the color filter 104. Liquid crystals of the liquid crystal layer 108 vary in alignment in response to an electric field applied thereto, and a light transmittance of the liquid crystal layer 108 is changed according to the alignment, thereby displaying an image.

According to the present invention, the crosstalk, the short-circuit and the disconnection of the lines are decreased, and the opening ratio is increased. Therefore, yield is increased, and image display quality of the display device is improved.

This invention has been described with reference to exemplary embodiments. It is evident, however, that many alternative modifications and variations will be apparent to those having skill in the art in light of the foregoing description. Accordingly, the present invention embraces all such alternative modifications and variations.

What is claimed is:

1. An array substrate comprising:
   a base substrate;
   a plurality of pixel electrodes disposed on the base substrate;

a plurality of first conductive lines disposed between the pixel electrodes;

a plurality of second conductive lines crossing the first conductive lines at crossing parts to form a matrix shape, at least two of the second conductive lines being disposed between adjacent pixels, a distance between the two second conductive lines at the crossing parts being substantially a maximum distance between the two second conductive lines disposed between the adjacent pixels; and a plurality of semiconductor patterns disposed at the crossing parts, respectively, each of the plurality of semiconductor patterns having a greater area than each of the crossing parts, a distance between adjacent semiconductor patterns being smaller than the maximum distance.

2. The array substrate of claim 1, wherein the plurality of semiconductor patterns are disposed between the first conductive lines and the second conductive lines at the crossing parts.

3. The array substrate of claim 1, wherein a distance between portions of the two second conductive lines outside of the crossing parts is less than the maximum distance.

4. The array substrate of claim 1, further comprising a plurality of thin film transistors arranged on the base substrate, each of the thin film transistors comprising:

a drain electrode electrically connected to a corresponding pixel electrode;

a gate electrode electrically connected to one of the first conductive lines; and a source electrode electrically connected to one of the second conductive lines.

5. The array substrate of claim 1, further comprising a plurality of thin film transistors arranged on the base substrate, each of the thin film transistors comprising:

a drain electrode electrically connected to a corresponding pixel electrode;

a source electrode electrically connected to one of the first conductive lines; and a gate electrode electrically connected to one of the second conductive lines.

6. The array substrate of claim 1, further comprising a storage line formed from a same layer as the first conductive lines to cross the second conductive lines at auxiliary crossing parts, and a distance between the two second conductive lines at the auxiliary crossing parts being greater than a distance between portions of the two second conductive lines outside of the crossing parts and the auxiliary crossing parts.

7. The array substrate of claim 6, further comprising a plurality of auxiliary semiconductor patterns disposed at the auxiliary crossing parts, respectively, and each of the auxiliary semiconductor patterns has a greater area than each of the auxiliary crossing parts.

8. The array substrate of claim 7, wherein the auxiliary semiconductor patterns are disposed between the first conductive lines and the second conductive lines at the auxiliary crossing parts.

9. A display device comprising:

an array substrate including:

a lower base substrate;

a plurality of pixel electrodes disposed on the lower base substrate;

a plurality of first conductive lines disposed between the pixel electrodes;

a plurality of second conductive lines crossing the first conductive lines at crossing parts to form a matrix shape, at least two of the second conductive lines being disposed between adjacent pixels, a distance between the two second conductive lines at the crossing parts being substantially a maximum distance between the two second conductive lines disposed between the adjacent pixels; and a plurality of semiconductor patterns disposed at the crossing parts, respectively, each of the semiconductor patterns having a greater area than each of the crossing parts, a distance between adjacent semiconductor patterns being smaller than the maximum distance;

an opposite substrate including:

an upper base substrate; and a common electrode on the upper base substrate; and a liquid crystal layer interposed between the array substrate and the opposite substrate.

10. The display device of claim 9, wherein the plurality of semiconductor patterns are disposed between the first conductive lines and the second conductive lines at the crossing parts.

11. The display device of claim 9, wherein a distance between portions of the two second conductive lines outside of the crossing parts is less than the maximum distance.

* * * * *